United States Patent
Fujimoto

(10) Patent No.: US 6,580,492 B2
(45) Date of Patent: Jun. 17, 2003

(54) RETICLE SYSTEM FOR MEASUREMENT OF EFFECTIVE COHERENCE FACTORS

(75) Inventor: Masashi Fujimoto, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 09/907,039

(22) Filed: Jul. 17, 2001

(65) Prior Publication Data

US 2002/0008860 A1 Jan. 24, 2002

(30) Foreign Application Priority Data

Jul. 19, 2000 (JP) ........................... 2000-218429

(51) Int. Cl.[7] ............... G03B 27/68; G03B 27/42
(52) U.S. Cl. ........................... 355/52; 355/53
(58) Field of Search ............... 355/52–53, 55, 355/67–71; 430/5, 20, 22, 30; 356/122–124, 399–401

(56) References Cited

U.S. PATENT DOCUMENTS 5,682,056 A * 10/1997 Sugawara .......... 257/435
5,703,675 A * 12/1997 Hirukawa et al. ...... 355/53
5,801,821 A *  9/1998 Borodovsky ........ 356/124

* cited by examiner

Primary Examiner—Henry Hung Nguyen
(74) Attorney, Agent, or Firm—Hayes Soloway P.C.

(57) ABSTRACT

A reticle system includes a reticle film having thereon a plurality of scale patterns each having a plurality of scale marks plotted therein, and a shield film having a plurality of pinholes each disposed corresponding to one of the scale patterns. A light emitted from a point light source having an effective coherent factor "x" and passing the reticle film at a scale mark "x" or below "x" in one of the scale patterns passes through the corresponding pinhole. After transferring the scale patterns onto a wafer surface, the effective coherent factors are read from the maximum scale marks for respective scale patterns on the wafer surface. The dispersion of the coherent factors can be calculated therefrom.

5 Claims, 5 Drawing Sheets

RETICLE SYSTEM FOR MEASUREMENT OF EFFECTIVE COHERENCE FACTORS

BACKGROUND OF THE INVENTION (a) Field of the Invention

The present invention relates to a reticle system for use in measurement of effective coherence factors (σ) in the exposure field of an exposure apparatus to calculate the dispersion of the effective coherent factors, and to a method for calculating the dispersion of the effective coherent factors by using the reticle system.

More specifically, the present invention relates to a reticle system that can accurately measure the effective coherent factors in the exposure field of an exposure apparatus without difficulty to calculate the dispersion of the effective coherent factors, and to a method for calculating the dispersion of the effective coherent factors.

(b) Description of the Related Art

Manufacture of semiconductor devices typically involves formation of a photoresist film on a wafer. An etching mask having thereon a circuit pattern is formed using a photolithographic step for the photoresist film, followed by etching the underlying layer by using the etching mask to form a circuit pattern on the wafer surface.

Typically, in the photolithographic process, an exposure apparatus is used to transfer a circuit pattern onto the photoresist film. Referring to FIG. 1, the exposure apparatus 100 includes a light source 101 such as a halogen lamp, a mirror system 102 for passing the light emitted from the light source 101, a condensing lens system 103 for focusing the light passed by the mirror system 102, a reticle 104 disposed on a reticle holder 105 in the exposure field of the exposure system 100, and a reducing lens system 106 for projecting the light that has passed through the reticle 104 onto a wafer 107 mounted on a stage 108.

Aberrations in the optical systems of the exposure apparatus 100, such as the condensing lens system 103 and the reducing lens system 106, cause influences on the process margin and dimensional dispersion in the exposure field of the reticle 104.

As semiconductor devices become more integrated and have smaller dimensions, the design rule for the semiconductor devices is on the verge of the resolution limit of the exposure apparatus. Thus, the influence by the aberrations in the optical system of the exposure apparatus becomes an increasingly serious problem.

In order to efficiently reduce the optical aberration, it is important to develop a method for accurately measuring the dispersion of the effective coherence factors in the exposure field.

The coherence factor represents the effective size or scale of the optical system. The dispersion of the coherence factors in the exposure field means the variations in the coherence factor at different positions inside the exposure field for each exposure shot. In consideration that coherence factor is a parameter that determines the image contrast, the dispersion of the coherence factors in the exposure field means the variations of exposure performance attained in the exposure field.

The dispersion of coherence factors significantly affects dispersion with respect to the dimensions of transferred patterns. Conventionally, by taking advantage of the tendency that isolated lines become narrower as the effective coherence factor increases, a reticle film, such as shown in FIG. 2A, is used having a plurality of patterns 32 thereon each including an isolated line pattern 34, such as shown in FIG. 2B. The isolated patterns were transferred onto a photoresist film, and the dimensions of the isolated patterns on the photoresist film are measured by using a SEM (Scanning Electron Microscope). The dispersion of the effective coherence factors was then qualitatively evaluated from the dimensional dispersion between these isolated lines in different positions of the exposure field.

In the conventional method, calculation for the dispersion of the effective coherence factors involves the following problems.

First, the accuracy of evaluating the dispersion of the effective coherence factors is relatively low. Second, the dispersion of the effective coherence factors cannot be evaluated quantitatively. Third, it takes a long time to measure the dimensions of the isolated line patterns by using the SEM.

SUMMARY OF THE INVENTION

It is therefore an object of the present invention to provide a reticle system that can accurately measure the dispersion of the effective coherence factors in the exposure field of the exposure apparatus without difficulty, and a method for calculating the dispersion of the effective coherence factors.

The present invention provides a reticle system for use in measuring an effective coherent factor in an exposure field, the reticle system including: a reticle film having thereon a plurality of scale patterns each having therein a plurality of scale marks; and a shield film disposed at a spaced relationship with respect to the reticle film and having a plurality of pinholes each disposed corresponding to one of the scale patterns, each of the scale patterns is such that a straight line passing a point light source having an effective coherent factor "x" and a corresponding one of the pinholes passes the reticle film at a scale mark "x" of the each of the scale patterns.

The reticle system for use in the measurement of an effective coherence factor, according to this invention, allows for the easy and precise measurement of the dispersion of the coherence factors in the exposure field due to aberrations in the illumination optical system, as well as the displacement of the optical axes of effective point light sources, namely illumination telecentricity.

The present invention also provides a method for measuring an effective coherent factor by using the reticle system of the present invention, the method including the steps of: transferring the scale marks onto a wafer surface by using an exposure apparatus; reading a maximum scale mark among a plurality of transferred scale marks in one of the scale patterns transferred onto the wafer surface; and determining the maximum scale mark as the effective coherent factor for the one of the scale patterns.

The method of the present invention also provides easy and precise measurement of the effective coherence factor, and calculation of the dispersion of the effective coherence factors based on the results of the effective coherence factors.

In accordance with the reticle system and the method of the present invention, the patterns transferred from the respective patterns in the reticle to the sample film represent the angle of the passed light beam with respect to the line passing through the scale pattern and the pin hole. Thus, the coherence factor for each of the scale patterns can be obtained, thereby enabling the dispersion of the coherence factors to be quantitatively evaluated.

DETAILED DESCRIPTION OF THE PREFERRED EMBODIMENTS

Embodiments of the present invention will be described in more detail with reference to the accompanying drawings by way of examples.

Figure 1:
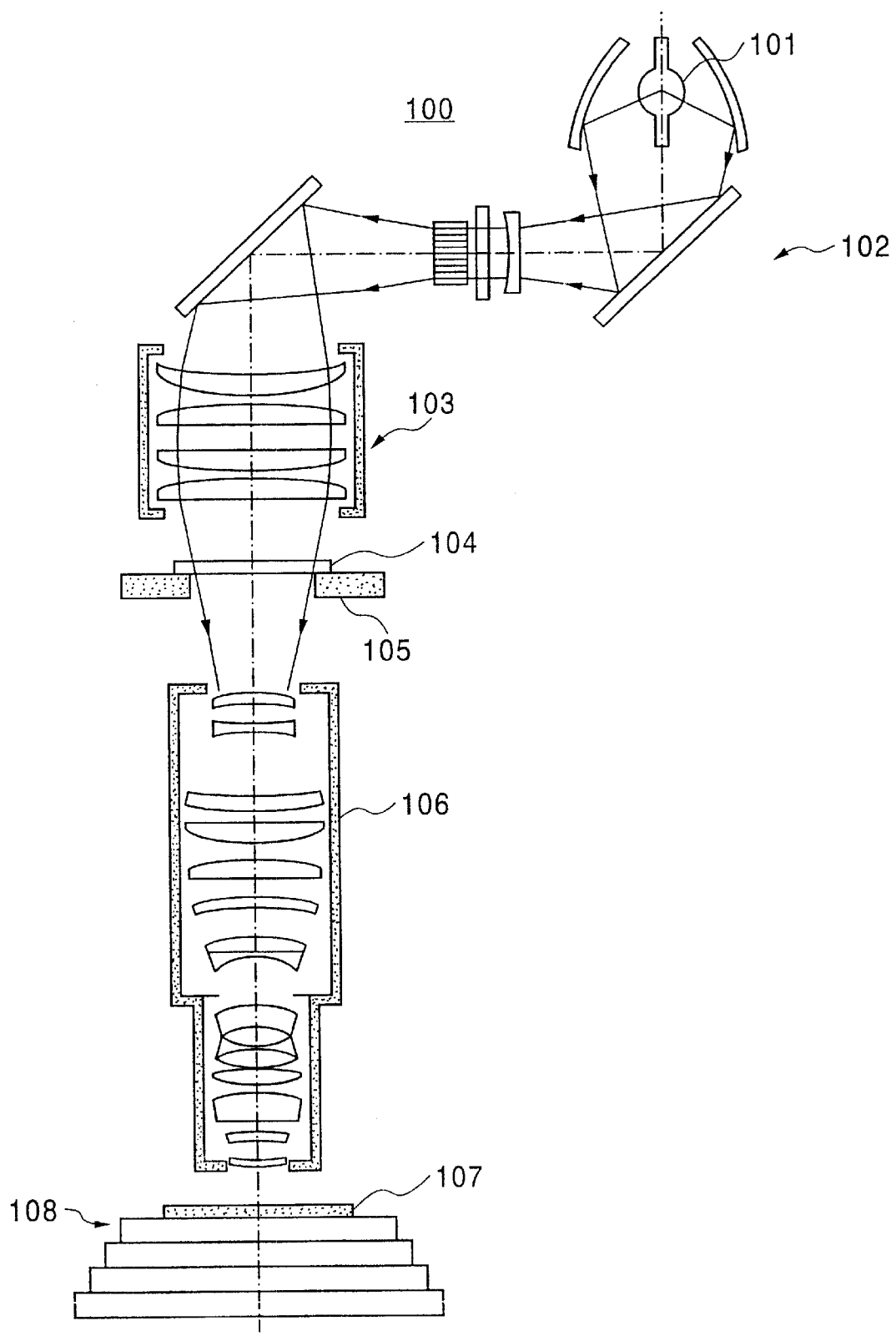
FIG. 1 is a schematic sectional view of a general exposure apparatus.
Figure 2A:
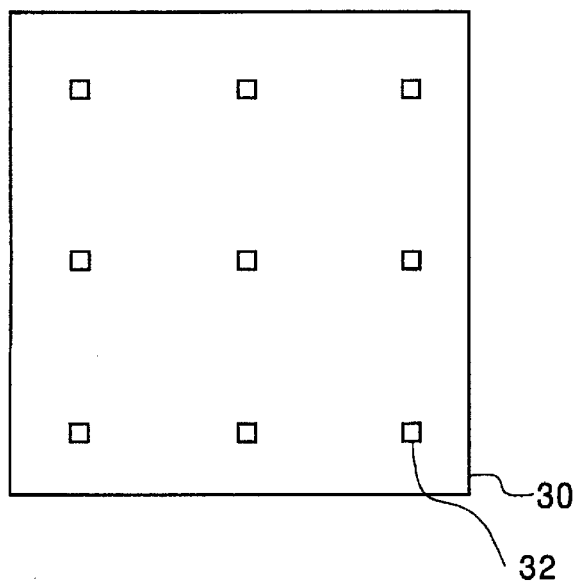
FIG. 2A is a top plan view illustrating a conventional reticle film used for measuring effective coherence factor.
Figure 2B:
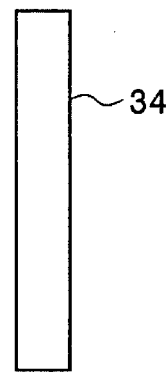
FIG. 2B is the detail of one of the line patterns formed on the reticle.
Figure 3:
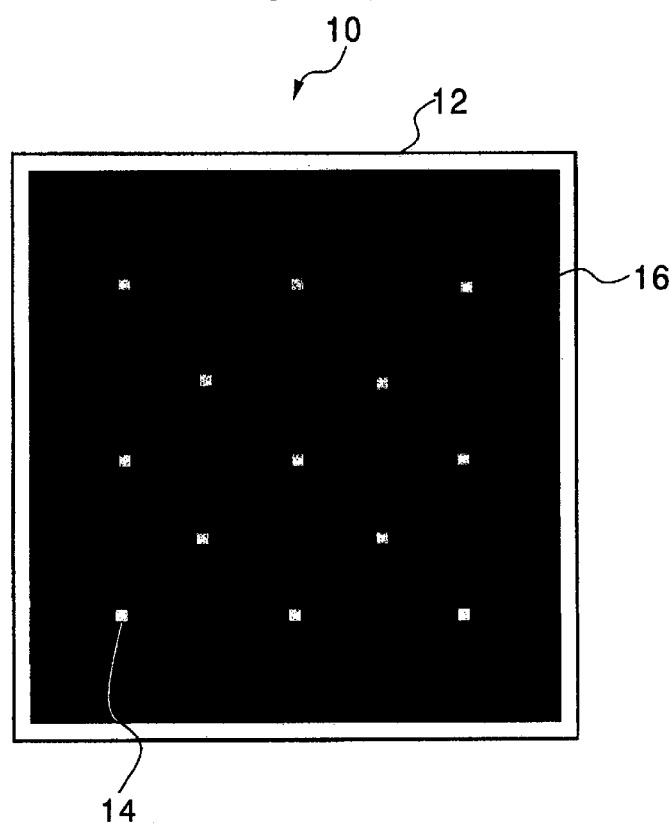
FIG. 3 is a bottom view of a reticle system according to an embodiment of the present invention, showing the configuration of the shield film in the reticle system.
Figure 4:
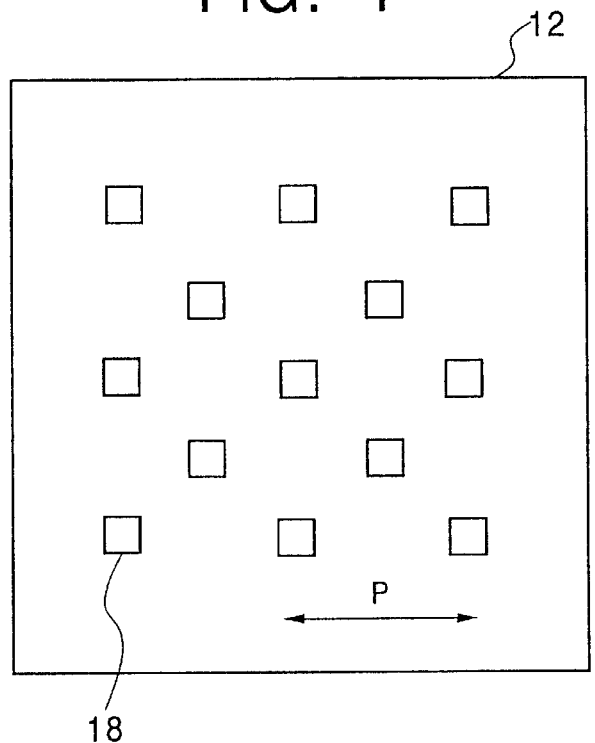
FIG. 4 is a top plan view of a reticle film in the reticle system of FIG. 3, showing the configuration of the reticle film in the reticle system.

FIG. 3 shows the bottom view of the reticle system to be used for measurement of effective coherence factor according to the present embodiment; and FIG. 4 shows the top plan view of the reticle system of the present embodiment.

In FIGS. 3 and 4, the reticle system 10 to be used for measurement of the effective coherence factor includes a reticle film 12 having a plurality of scale patterns 18 thereon, and a shield film 16 disposed below the reticle film 12 at a specified distance therefrom and having a plurality of pinholes 14 each corresponding to one of the scale patterns 18. Each of the pinholes 14 is disposed right under a corresponding one of the scale patterns 18.

The scale patterns 18 are arranged at respective grid points of the reticle film, with a space "P" of 110 mm therebetween, and at the center of each four grid points.

Figure 5:
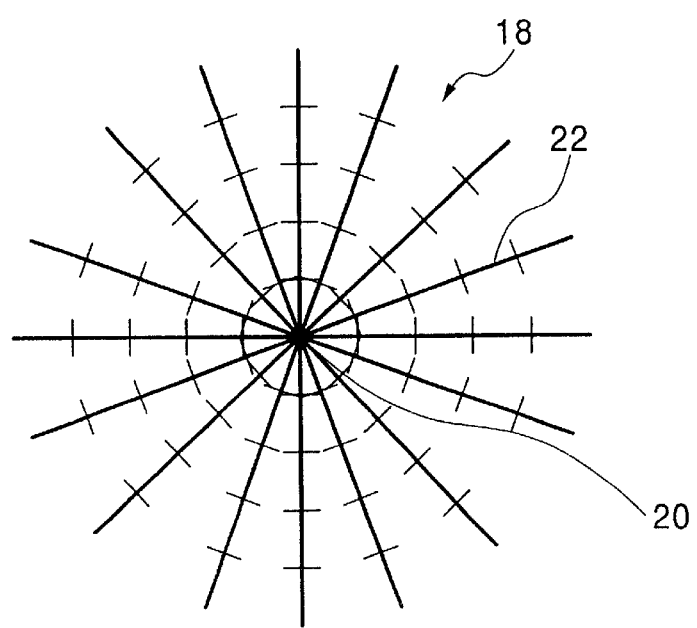
FIG. 5 is a top plan view of the scale pattern formed on the reticle film shown in FIG. 4.

Each scale pattern 18 has a configuration shown in FIG. 5, and used for evaluation of effective coherence factor. More specifically, each scale pattern 18 includes a center of the pattern and sixteen straight lines 22 passing the center and disposed at equal angular intervals or 22.5 degrees.

Figure 6:
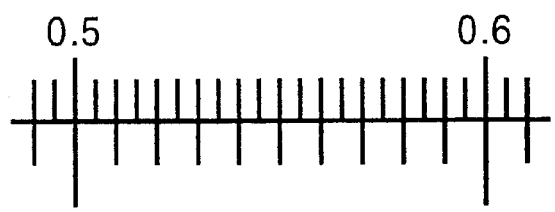
FIG. 6 is a schematic diagram showing a part of a scale pattern formed on the reticle system of FIG. 3.

Each of the straight lines 22 has a width of several micrometers to several tens of micrometers. The straight line 22 has a scale calibrated or plotted from 0 to 1, or from 0 to the maximum of the coherence factor in the exposure field. FIG. 6 exemplarily shows a portion of the straight line 22 plotted by the scale marks between the scale mark "0.5" and the scale mark "0.6".

In FIG. 3, the shield film 16 has a plurality of pinholes 14 each having a diameter of several tens of micrometers. The pinholes 14 are arranged right under the centers of the respective scale patterns 18, as shown in FIG. 7, with the space between the scale pattern 22 and the pinhole being 10 mm in this example.

Figure 7:
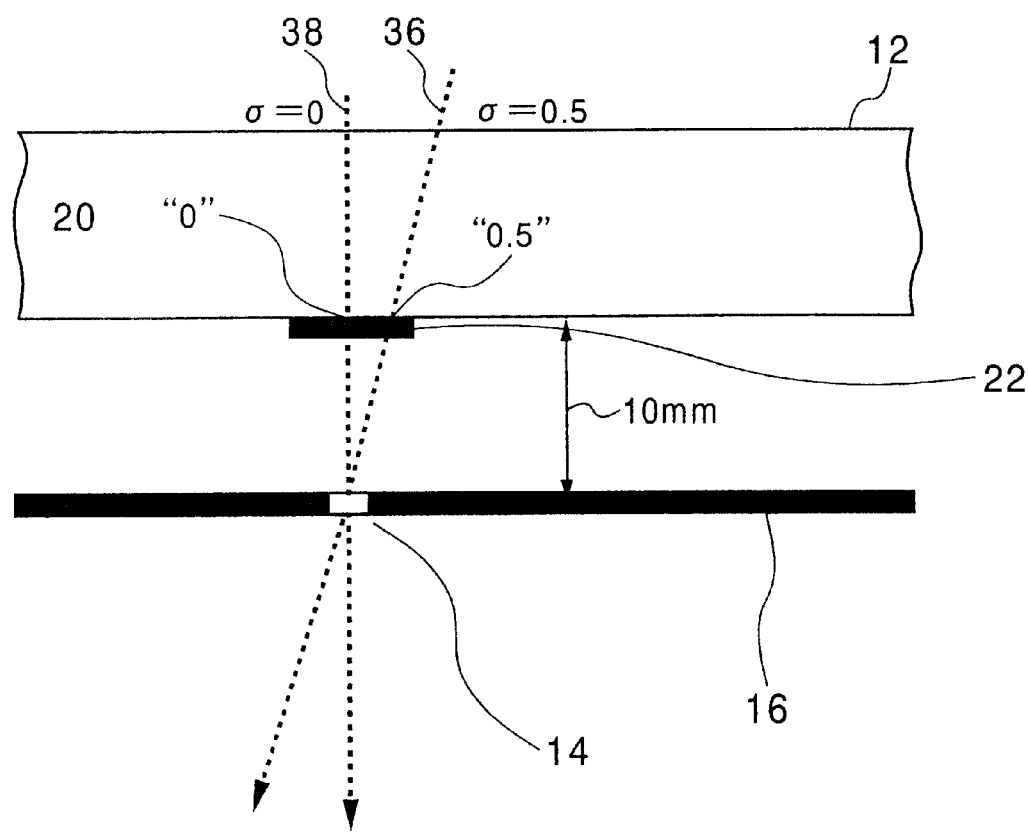
FIG. 7 is a sectional view of the reticle system of FIG. 3, showing the relationship between the scale pattern on the reticle film and the light passed by the pin hole on the shield film.

FIG. 7 also shows that the scale pattern 22 is calibrated so that if the light 36 or 38, emitted from a point light source (not shown) located at a position where coherence factor is x, passes through the pinhole 14, the light necessarily passes the pattern 22 of the reticle 12 at the scale mark "x" and then the pinhole 14.

More accurately, a straight line passing a point light source having an effective coherent factor "x" and the pinhole 14 passes or crosses the reticle film 12 at the scale mark "x" of each of the scale patterns. FIG. 7 illustrates the cases of "x" being "0.5" and "0" for the lights 36 and 38, respectively.

Since the light, emitted from the point light source where coherence factor is x, passes the scale pattern 22 at the scale mark x before reaching the pinhole 14, the scale mark x of the pattern has a one-to-one correspondence with the light emitted from the point light source and passing the corresponding pinhole 14.

For example, provided that the numerical aperture (NA) of the projection lens is 0.65 and the reduction ratio of the optical system is ⅕, the sinusoid of angle θ (θ is the angle that the illumination light emitted from the point light source where coherence factor is 0.8 forms with respect to the optical axis) is calculated by the relationship of sin θ=0.65×⅕×0.8=0.10. Then, in consideration that the distance between the reticle 12 and the pinhole 14 in the shield film 16 is 10 mm, the scale mark 0.8 is disposed at a position of 10×tan θ=1.0 mm away from the pattern center.

As described above, the pattern 22 has a scale calibrated from "0" to "1" or "0" to the maximum of the coherence factor, with the pattern center being "0". Since the line width of the pattern 22 ranges from several micrometers to several tens of micrometers, which is significantly larger compared to the wavelength of the exposure light, the effect of diffraction is insignificant and the transfer of the scale pattern can be treated on the basis of the geometric optics.

In the configuration as described above, the pinhole 14 having a diameter of several tens of micrometers and formed in the shield film 16 located directly underneath the pattern center (at scale mark 0), allows only the light emitted from a position which forms a specific angle or below the specific angle with respect to the optical axis of the reticle system to pass. Thus, the pinhole 14 passes only the specific light to be incident onto the wafer surface. The pattern transferred onto the wafer surface has a specific scale mark corresponding to the light emitted from the specific position, and the transferred scale mark can be read to show the specific angle or the coherent factor.

Using the reticle system 10 of the present embodiment, the effective coherence factor in the exposure field can be accurately measured without difficulty by reading the maximum of the scale marks in each scale pattern transferred onto the wafer surface.

The scale marks on the respective field positions of the wafer surface are read to obtain the effective coherence factors, whereby the dispersion in the effective coherence factors can be calculated while using the statistical technique.

Thus, dispersion of the effective coherence factors in the field positions, caused by aberrations in the illumination optical systems, is accurately calculated without difficulty. This allows an accurate control for the aberrations in the illumination optical systems.

The following is more detailed description for the principle of the present invention.

As already stated with reference to FIG. 7, the light emitted from a specified point light source, wherein the coherence factor is "x", passes the scale pattern at the scale mark "x" and then passes the corresponding pinhole 14 to be incident onto the wafer surface. Therefore, the scale mark "x" of the pattern has a one-to-one correspondence with the light that is emitted from the point light source wherein coherence factor is "x" and passed by the corresponding pinhole 14.

Figure 8:
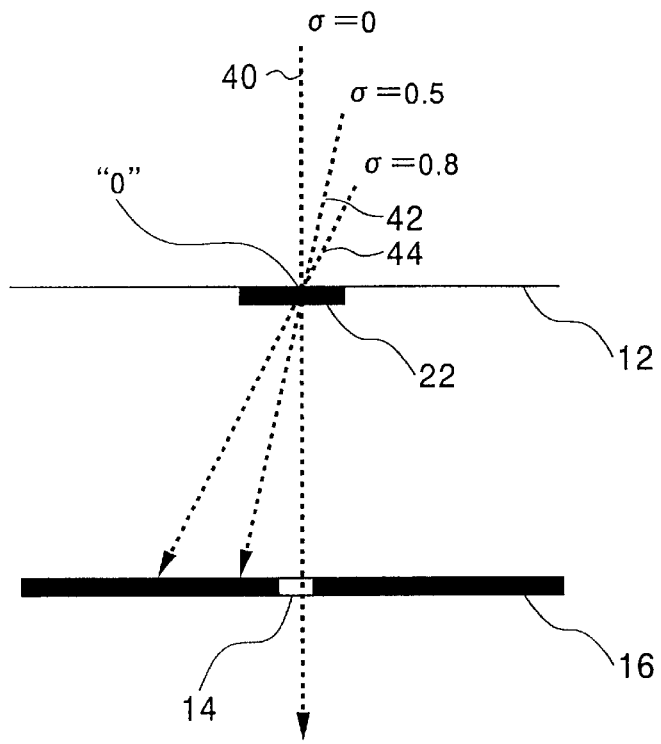
FIG. 8 is a sectional view of the reticle system of FIG. 3, showing whether or not the specific lights passing at the scale mark "0" are capable of passing the pinhole on the shield film.

With reference to FIG. 8, the situations of the lights emitted from point light source having different coherent factors and passing the scale pattern at scale mark "0" (pattern center) are now considered.

The pattern center 20 is irradiated by the lights emitted from point light sources of various values of coherence factor at different angles. In this case, the light that can pass through the pinhole 14 and reaches the wafer surface is only the light 40 that is parallel to the optical axis passing the pinhole 14 and the center of the scale pattern perpendicularly to the reticle system. This is the light 40 emitted from the point light source where the coherence factor is "0.

For example, "the lights 42 and 44 that are emitted from the point light sources where the coherence factors are 0.5 and 0.8 cannot pass through the pinhole 14.

Figure 9:
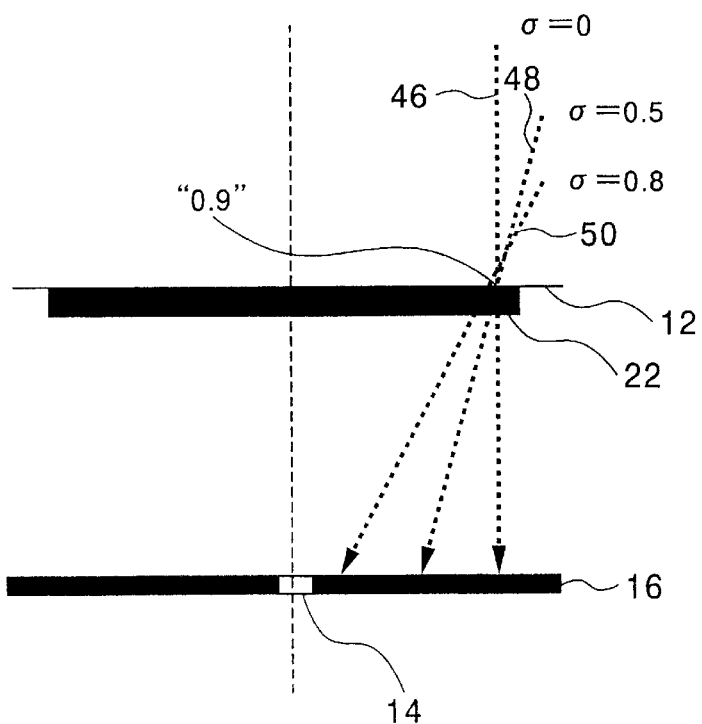
FIG. 9 is a sectional view of the reticle system of FIG. 3, showing that the specific lights passing at the scale mark "0.9" are not capable of passing the pinhole on the shield film.

Referring now to FIG. 9, the situations of the lights passing the scale pattern at the scale mark "0.9" are considered. The lights 46, 48 and 50 emitted from point light sources of which coherence factors are "0", "0.5" and "0.8" and passing the scale mark "0.9" do not pass through the pinhole 14 in the shield film 16.

More specifically, the scale mark "0.9" is not transferred onto the wafer except that there is a light of which the incident angle is large enough to pass the scale mark "0.9" and reach the pinhole 14. Therefore, the maximum scale mark transferred onto the wafer surface indicates the existence of light of which the incident angle is the maximum: in other words, the maximum scale mark indicates the effective coherence factor of the point light source. Thus, it is possible to measure the effective coherence factor at each position by reading the maximum scale mark among the scale marks transferred onto the photoresist film on the wafer.

The maximum scale mark transferred onto the wafer surface and corresponding to the point light source which has the maximum incident angle at each field position allows the effective coherence factor to be measured at each field position in the exposure light.

In the method of the present embodiment, based on the above principle of the effective coherence factor, the reticle system including the reticle film 12 and the shield film 16 located in a predetermined position under the reticle 12, is first mounted on the reticle holder of an exposure apparatus.

Next, the scale pattern 18 for the effective coherence factor, or the pattern 22, is transferred onto the photoresist film formed on the wafer.

Then, the maximum scale mark of the pattern 22 transferred onto the photoresist film on the wafer is read at each of the patterned marks. This readout mark is recorded as the effective coherence factor at the position of the transferred pattern inside the exposure field.

The effective coherence factors at the respective positions of the transferred scale patterns inside the exposure field are read out, and the dispersion of the effective coherence factors between such positions is calculated using the statistical technique.

In this way, using the reticle system 10, including the reticle film 12 and the shield film 16, for the measurement of effective coherence factor, it is possible to accurately measure the effective coherence factors without difficulty, and calculate the dispersion of the effective coherence factors based on the measurement results of the effective coherence factors.

Thus, the dispersion of the effective coherence factors between field positions due to aberrations in the optical system can be accurately calculated without difficulty. Based on the calculated results, the aberrations of the optical system can be efficiently and accurately adjusted. Consequently, the dispersion of the pattern dimensions in the exposure field is significantly reduced and the production yield is considerably improved.

The present invention allows the easy and precise measurement of the dispersion of the coherence factors in the exposure field due to aberrations in the illumination optical system, as well as the displacement of the optical axes of effective point light sources, known as illumination telecentricity.

Since the above embodiments are described only for examples, the present invention is not limited to the above embodiments and various modifications or alterations can be easily made therefrom by those skilled in the art without departing from the scope of the present invention.

What is claimed is:

1. A reticle system for use in measuring an effective coherent factor in an exposure field, said reticle system comprising:
    a reticle film having thereon a plurality of scale patterns each having therein a plurality of scale marks; and
    a shield film disposed at a spaced relationship with respect to said reticle film and having a plurality of pinholes each disposed corresponding to one of said scale patterns, each of said scale patterns is such that a straight line passing a point light source having an effective coherent factor "x" and a corresponding one of said pinholes passes said reticle film at a scale mark "x" of said each of said scale patterns.

2. The reticle system as defined in claim 1, wherein each of said scale patterns includes a center and a plurality of scale lines each passing said center and attached with said plurality of scale marks.

3. The reticle system as defined in claim 1, wherein said scale marks includes an original point having a mark value "0" and an end point having a mark value of "1" or a maximum coherent factor in an exposure field.

4. A method for measuring an effective coherent factor by using the reticle system as defined in claim 1, said method comprising:
    first step of transferring said scale marks onto a wafer surface by using an exposure apparatus;
    second step of reading a maximum scale mark among a plurality of transferred scale marks in one of said scale patterns transferred onto said wafer surface; and
    third step of determining said maximum scale mark as the effective coherent factor for said one of said scale patterns.

5. The method as defined in claim 4, further comprising the steps of iterating said second and third steps to determine a plurality of effective coherent factors for others of said scale marks transferred onto said wafer surface, and calculating a dispersion of said effective coherent factors for said exposure apparatus.

* * * * *